(12) United States Patent
Tan et al.

(10) Patent No.: US 12,310,108 B2
(45) Date of Patent: May 20, 2025

(54) BASE PLATE AND DISPLAY PANEL

(71) Applicant: SHENZHEN CHINA STAR OPTOELECTRONICS SEMICONDUCTOR DISPLAY TECHNOLOGY CO., LTD., Shenzhen (CN)

(72) Inventors: Xiaofang Tan, Shenzhen (CN); Zhiwei Song, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/607,317

(22) PCT Filed: Sep. 7, 2021

(86) PCT No.: PCT/CN2021/116863
§ 371 (c)(1),
(2) Date: Feb. 23, 2023

(87) PCT Pub. No.: WO2023/019654
PCT Pub. Date: Feb. 23, 2023

(65) Prior Publication Data
US 2024/0047466 A1    Feb. 8, 2024

(30) Foreign Application Priority Data

Aug. 16, 2021   (CN) .......................... 202110936401.8

(51) Int. Cl.
*G02F 1/1333*   (2006.01)
*G02F 1/1362*   (2006.01)
(Continued)

(52) U.S. Cl.
CPC ....... *H10D 86/60* (2025.01); *G02F 1/133345* (2013.01); *G02F 1/136209* (2013.01);
(Continued)

(58) Field of Classification Search
CPC ............. G02F 1/1333; G02F 1/133345; G02F 1/133357; G02F 1/1362; G02F 1/136209;
(Continued)

(56) References Cited

U.S. PATENT DOCUMENTS

2008/0303020 A1* 12/2008 Shin .................. H01L 29/66969
257/E29.151
2017/0278974 A1* 9/2017 Yoshitani .............. H01L 29/518
(Continued)

FOREIGN PATENT DOCUMENTS

| CN | 106684103 A | 5/2017 |
| CN | 109166896 A | 1/2019 |

(Continued)

OTHER PUBLICATIONS

Korean Office Action issued in corresponding Korean Patent Application No. 10-2021-7033720 dated Jun. 23, 2023, pp. 1-14.
(Continued)

*Primary Examiner* — Thoi V Duong
(74) *Attorney, Agent, or Firm* — PV IP PC Chung, Wei Te; Wei Te Chung (57) ABSTRACT

An embodiment of the present application describes a base plate and a display panel, where a thin film transistor has a gate electrode, an active layer, and a source-drain metal layer. The active layer is arranged in a different layer from the gate electrode, and the active layer is disposed to overlap the gate electrode. The barrier layer at least covers the active layer and the gate electrode, and the barrier layer is used to block water and oxygen. The flat layer covers the barrier layer; and the source-drain metal layer is arranged on the flat (Continued)

layer. The source-drain metal layer has a source electrode and a drain electrode, and the source electrode and the drain electrode are respectively connected to the active layer.

16 Claims, 3 Drawing Sheets

(51) Int. Cl.
*G02F 1/1368* (2006.01)
*H10D 86/40* (2025.01)
*H10D 86/60* (2025.01)

(52) U.S. Cl.
CPC ......... *G02F 1/1368* (2013.01); *H10D 86/423* (2025.01); *G02F 1/133357* (2021.01); *G02F 1/136227* (2013.01)

(58) Field of Classification Search
CPC ............ G02F 1/136285; G02F 1/1368; H01L 27/1222; H01L 27/1225; H01L 27/1248; H01L 29/78606; H01L 29/78633; H10K 59/1213; H10K 59/124
See application file for complete search history.

(56) References Cited

U.S. PATENT DOCUMENTS

2019/0172954 A1* 6/2019 Zhou ................. H01L 21/47635
2019/0326370 A1 10/2019 Lu
2019/0386035 A1* 12/2019 Li ....................... H01L 29/7869
2020/0321469 A1* 10/2020 Hayashi .............. H01L 29/7869

FOREIGN PATENT DOCUMENTS

| CN | 110556404 A | 12/2019 |
|---|---|---|
| CN | 110571224 A | 12/2019 |
| CN | 112086483 A | 12/2020 |
| CN | 113097230 A | 7/2021 |
| EP | 3751616 A1 | 12/2020 |
| JP | 2013206919 A | 10/2013 |
| JP | 2018005236 A | 1/2018 |
| JP | 2020536262 A | 12/2020 |
| KR | 20200060761 A | 6/2020 |
| KR | 20200143623 A | 12/2020 |

OTHER PUBLICATIONS

Japanese Office Action issued in corresponding Japanese Patent Application No. 特願 2021-555292 dated Oct. 31, 2023, pp. 1-4.
International Search Report in International application No. PCT/CN2021/116863, mailed on May 17, 2022.
Written Opinion of the International Search Authority in International application No. PCT/CN2021/116863, mailed on May 17, 2022.
Chinese Office Action issued in corresponding Chinese Patent Application No. 202110936401.8 dated Jan. 18, 2023, pp. 1-6.

* cited by examiner

BASE PLATE AND DISPLAY PANEL

RELATED APPLICATIONS

This application is a Notional Phase of PCT Patent Application No. PCT/CN2021/116863 having international filing date Sep. 7, 2021, which claims the benefit of priority of Chinese Patent Application No. 202110936401.8 filed on Aug. 16, 2021. The contents of the above applications are all incorporated by reference as if fully set forth herein in their entirety.

FIELD OF DISCLOSURE

The present disclosure relates to displays, and more particularly to a base plate and a display panel.

BACKGROUND OF DISCLOSURE

Compared with traditional liquid crystal panels, active matrix organic light-emitting diode panels have characteristics of fast response, high contrast, wider viewing angle, and low energy consumption. Therefore, it is very popular and is gradually replacing the liquid crystal display panel as the next generation mainstream display panel.

During a research and practice of the prior art, the inventor of the present application found that both liquid crystal panels and organic light-emitting diode panels face a problem. That is, the active layer is easily affected by factors such as hydrogen, water, and oxygen invaded from the outside, which causes electrical deviation of the thin film transistor, and ultimately reduces reliability of the panel.

SUMMARY OF DISCLOSURE

An embodiment of the present application provides a base plate and a display panel, which can reduce risk of hydrogen, water, and oxygen intruding into an active layer.

An embodiment of the present application provides a base plate comprising:
a substrate; and
a plurality of thin film transistors, wherein the thin film transistors are arranged on the substrate;
wherein the thin film transistors comprise:
  a gate electrode, wherein the gate electrode is disposed on the substrate;
  an active layer, wherein the active layer is disposed on the substrate and arranged in a different layer from the gate electrode, and the active layer is arranged to overlap the gate electrode;
  a barrier layer, wherein the barrier layer at least covers the active layer and the gate electrode, and the barrier layer is used to block water and oxygen;
  a flat layer, wherein the flat layer covers the barrier layer; and a source-drain metal layer, wherein the source-drain metal layer is disposed on the flat layer, the source-drain metal layer comprises a source electrode and a drain electrode, and the source electrode and the drain electrode are respectively connected to the active layer.

Optionally, in some embodiments of the present application, the base plate further comprises a first insulating layer, the first insulating layer is disposed on the active layer, and the gate electrode is disposed on the first insulating layer; and
wherein the active layer, the first insulating layer, and the gate electrode are stacked to form a protrusion structure, and the barrier layer covers an outer surface of the protrusion structure.

Optionally, in some embodiments of the present application, the active layer comprises a first top surface and a first side surface connected to a periphery of the first top surface;
wherein the first insulating layer is disposed in a middle area of the first top surface, and the first insulating layer comprises a second top surface and a second side surface connected to a periphery of the second top surface;
wherein the gate electrode is disposed on the second top surface, and the gate electrode comprises a third top surface and a third side surface connected to a periphery of the third top surface; and
wherein the barrier layer covers a side area of the first top surface, the first side surface, the second side surface, the third top surface, and the third side surface.

Optionally, in some embodiments of the present application, the base plate further comprises a light-shielding layer, a buffer layer, and a second insulating layer, wherein the light-shielding layer is provided on the substrate, the light-shielding layer is arranged to overlap the active layer, the buffer layer is disposed between the light-shielding layer and the active layer, and the second insulating layer is disposed on the source-drain metal layer;
wherein the source-drain metal layer further comprises a source electrode extension line, and the source electrode extension line is respectively connected to the source electrode and the light-shielding layer.

Optionally, in some embodiments of the present application, the base plate further comprises a first insulating layer, the first insulating layer is disposed on the gate electrode, and the active layer is disposed on the first insulating layer; and
wherein the barrier layer covers an outer surface of the active layer.

Optionally, in some embodiments of the present application, the first insulating layer is provided with a trench, the trench is provided around an outer periphery of the gate electrode, and the barrier layer covers the trench.

Optionally, in some embodiments of the present application, a density of the barrier layer is greater than or equal to 2.5 g/cm$^3$.

Optionally, in some embodiments of the present application, the barrier layer has a single-layer structure, and material of the barrier layer comprises metal oxide.

Optionally, in some embodiments of the present application, the barrier layer comprises a first barrier layer and a second barrier layer, the second barrier layer is disposed on the first barrier layer, material of the first barrier layer comprises metal oxide, and material of the second barrier layer comprises silicon oxide.

Optionally, in some embodiments of the present application, material of the active layer includes one of polycrystalline silicon, single crystal silicon, and metal oxide.

Correspondingly, an embodiment of the present application further provides a display panel, which includes a base plate as described in the foregoing embodiment. The display panel further comprises a first electrode, a light-emitting layer, and a second electrode that are stacked, and the first electrode is connected to a drain electrode,
wherein the base plate comprises:
  a substrate; and
  a plurality of thin film transistors, wherein the thin film transistors are arranged on the substrate, wherein the thin film transistors comprise:
a gate electrode, wherein the gate electrode is disposed on the substrate;
an active layer, wherein the active layer is disposed on the substrate and arranged in a different layer from the gate electrode, and the active layer is arranged to overlap the gate electrode;
a barrier layer, wherein the barrier layer at least covers the active layer and the gate electrode, and the barrier layer is used to block water and oxygen;
a flat layer, wherein the flat layer covers the barrier layer; and
a source-drain metal layer, wherein the source-drain metal layer is disposed on the flat layer, the source-drain metal layer comprises a source electrode and the drain electrode, and the source electrode and the drain electrode are respectively connected to the active layer.

Optionally, in some embodiments of the present application, the base plate further comprises a first insulating layer, the first insulating layer is disposed on the active layer, and the gate electrode is disposed on the first insulating layer; and
wherein the active layer, the first insulating layer, and the gate electrode are stacked to form a protrusion structure, and the barrier layer covers an outer surface of the protrusion structure.

Optionally, in some embodiments of the present application, the active layer comprises a first top surface and a first side surface connected to a periphery of the first top surface;
wherein the first insulating layer is disposed in a middle area of the first top surface, and the first insulating layer comprises a second top surface and a second side surface connected to a periphery of the second top surface;
wherein the gate electrode is disposed on the second top surface, and the gate electrode comprises a third top surface and a third side surface connected to a periphery of the third top surface; and
wherein the barrier layer covers a side area of the first top surface, the first side surface, the second side surface, the third top surface, and the third side surface.

Optionally, in some embodiments of the present application, the base plate further comprises a light-shielding layer, a buffer layer, and a second insulating layer, wherein the light-shielding layer is provided on the substrate, the light-shielding layer is arranged to overlap the active layer, the buffer layer is disposed between the light-shielding layer and the active layer, and the second insulating layer is disposed on the source-drain metal layer;
wherein the source-drain metal layer further comprises a source electrode extension line, and the source electrode extension line is respectively connected to the source electrode and the light-shielding layer.

Optionally, in some embodiments of the present application, the base plate further comprises a first insulating layer, the first insulating layer is disposed on the gate electrode, and the active layer is disposed on the first insulating layer; and
wherein the barrier layer covers an outer surface of the active layer.

Optionally, in some embodiments of the present application, the first insulating layer is provided with a trench, the trench is provided around an outer periphery of the gate electrode, and the barrier layer covers the trench.

Optionally, in some embodiments of the present application, a density of the barrier layer is greater than or equal to 2.5 g/cm$^3$.

Optionally, in some embodiments of the present application, the barrier layer has a single-layer structure, and material of the barrier layer comprises metal oxide.

Optionally, in some embodiments of the present application, the barrier layer comprises a first barrier layer and a second barrier layer, the second barrier layer is disposed on the first barrier layer, material of the first barrier layer comprises metal oxide, and material of the second barrier layer comprises silicon oxide.

Optionally, in some embodiments of the present application, material of the active layer includes one of polycrystalline silicon, single crystal silicon, and metal oxide.

Correspondingly, an embodiment of the present application also provides another display panel, which includes an array substrate, a counter substrate, and a liquid crystal disposed between the array substrate and the counter substrate; wherein the array substrate comprises the base plate of the above-mentioned embodiment;
wherein the base plate comprises:
a substrate; and
a plurality of thin film transistors, wherein the thin film transistors are arranged on the substrate,
wherein the thin film transistors comprise:
a gate electrode, wherein the gate electrode is disposed on the substrate;
an active layer, wherein the active layer is disposed on the substrate and arranged in a different layer from the gate electrode, and the active layer is arranged to overlap the gate electrode;
a barrier layer, wherein the barrier layer at least covers the active layer and the gate electrode, and the barrier layer is used to block water and oxygen;
a flat layer, wherein the flat layer covers the barrier layer; and
a source-drain metal layer, wherein the source-drain metal layer is disposed on the flat layer, the source-drain metal layer comprises a source electrode and the drain electrode, and the source electrode and the drain electrode are respectively connected to the active layer.

Optionally, in some embodiments of the present application, the base plate further comprises a first insulating layer, the first insulating layer is disposed on the active layer, and the gate electrode is disposed on the first insulating layer; and
wherein the active layer, the first insulating layer, and the gate electrode are stacked to form a protrusion structure, and the barrier layer covers an outer surface of the protrusion structure.

Optionally, in some embodiments of the present application, the active layer comprises a first top surface and a first side surface connected to a periphery of the first top surface;
wherein the first insulating layer is disposed in a middle area of the first top surface, and the first insulating layer comprises a second top surface and a second side surface connected to a periphery of the second top surface;
wherein the gate electrode is disposed on the second top surface, and the gate electrode comprises a third top surface and a third side surface connected to a periphery of the third top surface; and
wherein the barrier layer covers a side area of the first top surface, the first side surface, the second side surface, the third top surface, and the third side surface.

Optionally, in some embodiments of the present application, the base plate further comprises a light-shielding layer, a buffer layer, and a second insulating layer, wherein the light-shielding layer is provided on the substrate, the light-shielding layer is arranged to overlap the active layer, the buffer layer is disposed between the light-shielding layer and the active layer, and the second insulating layer is disposed on the source-drain metal layer;

wherein the source-drain metal layer further comprises a source electrode extension line, and the source electrode extension line is respectively connected to the source electrode and the light-shielding layer.

Optionally, in some embodiments of the present application, the base plate further comprises a first insulating layer, the first insulating layer is disposed on the gate electrode, and the active layer is disposed on the first insulating layer; and wherein the barrier layer covers an outer surface of the active layer.

Optionally, in some embodiments of the present application, the first insulating layer is provided with a trench, the trench is provided around an outer periphery of the gate electrode, and the barrier layer covers the trench.

Optionally, in some embodiments of the present application, a density of the barrier layer is greater than or equal to 2.5 g/cm$^3$.

Optionally, in some embodiments of the present application, the barrier layer has a single-layer structure, and material of the barrier layer comprises metal oxide.

Optionally, in some embodiments of the present application, the barrier layer comprises a first barrier layer and a second barrier layer, the second barrier layer is disposed on the first barrier layer, material of the first barrier layer comprises metal oxide, and material of the second barrier layer comprises silicon oxide.

Optionally, in some embodiments of the present application, material of the active layer includes one of polycrystalline silicon, single crystal silicon, and metal oxide.

In a base plate and a display panel adopted in the embodiments of the present application, the thin film transistor includes a gate electrode, an active layer, and a source-drain metal layer. The active layer is arranged in a different layer from the gate electrode, and the active layer is disposed to overlap the gate electrode. The barrier layer at least covers the active layer and the gate electrode, and the barrier layer is used to block water and oxygen. The flat layer covers the barrier layer; and the source-drain metal layer is arranged on the flat layer. The source-drain metal layer includes a source electrode and a drain electrode, and the source electrode and the drain electrode are respectively connected to the active layer. In an embodiment of the present application, a barrier layer is used to at least cover the gate electrode and active layer of the thin film transistor to prevent external hydrogen, oxygen, and water vapor from intruding into the gate electrode and the active layer. Further, the use of a flat layer to flatten a stacked structure of the active layer and the gate electrode, thereby reducing a risk of the source-drain metal layer and the above film layer being affected by a complicated topography.

DESCRIPTION OF DRAWINGS

In order to more clearly describe technical solutions in embodiments of the present application, the following will briefly introduce the drawings that need to be used in the description of the embodiments. Obviously, the drawings in the following description are only some embodiments of the application. For those skilled in the art, other drawings can be obtained based on these drawings without creative work.

DETAILED DESCRIPTION OF PREFERRED EMBODIMENTS

The technical solutions in the embodiments of the present application will be clearly and completely described below in conjunction with the drawings in the embodiments of the present application. Obviously, the described embodiments are only a part of the embodiments of the present application, rather than all the embodiments. Based on the embodiments in this application, all other embodiments obtained by those skilled in the art without creative work shall fall within the protection scope of this application. In addition, it should be understood that the specific implementations described here are only used to illustrate and explain the application, and are not used to limit the application. In this application, unless otherwise stated, directional words used such as "upper" and "lower" usually refer to the upper and lower positions of the device in actual use or working state, and specifically refer to the drawing directions in the drawings; and "inner" and "outer" refer to the outline of the device.

The embodiments of the present application provide a base plate and a display panel. In addition, a source electrode and a drain electrode of the thin film transistor are interchangeable. In an embodiment of the present application, in order to distinguish two electrodes of the thin film transistor except the gate electrode, one of the electrodes is called the source electrode and the other is called the drain electrode. Details are described below. It should be noted that the order of description in the following embodiments is not meant to limit the preferred order of the embodiments.

Figure 1:
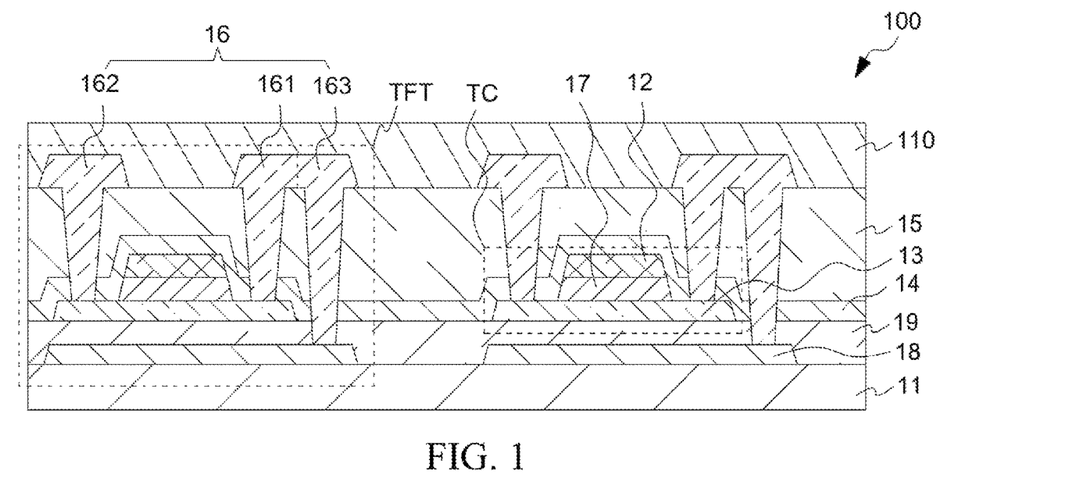
FIG. 1 is a schematic structural diagram of a first embodiment of a base plate provided by the present application.

FIG. 1 is a schematic structural diagram of a first embodiment of a base plate provided by the present application. The embodiment of the present application provides a base plate 100, which includes a substrate 11 and a plurality of thin film transistors TFT. A plurality of thin film transistors TFT are provided on the substrate 11.

The thin film transistor TFT includes a gate electrode 12, an active layer 13, a barrier layer 14, a flat layer 15, and a source-drain metal layer 16.

The gate electrode 12 is provided on the substrate 11. The active layer 13 is disposed on the substrate 11 and is disposed in a different layer from the gate electrode 12. The active layer 13 is arranged to overlap the gate electrode 12.

The barrier layer 14 at least covers the active layer 13 and the gate electrode 12. The barrier layer 14 is used to block water and oxygen. The flat layer 15 covers the barrier layer 14. The source-drain metal layer 16 includes a source electrode 161 and a drain electrode 162, and the source-drain metal layer 16 is disposed on the flat layer 15. The source electrode 161 and the drain electrode 162 are respectively connected to the active layer 13.

The base plate 100 of an embodiment of the present application adopts a barrier layer 14 to at least cover the gate electrode 12 and the active layer 13 of the thin film transistor TFT, so as to prevent external hydrogen, oxygen and water vapor from entering the gate electrode 12 and the active layer 13. In addition, the flat layer 15 is used to flatten a stacked structure of the active layer 13 and the gate electrode 12, thereby reducing a risk of the source-drain metal layer 16 and above film layers being affected by the complicated topography. Therefore, t the luminous efficiency of the panel is improved.

Optionally, the substrate 11 may be a rigid substrate or a flexible substrate. Material of the substrate 11 includes one of glass, sapphire, silicon, silicon dioxide, polyethylene, polypropylene, polystyrene, polylactic acid, polyethylene terephthalate, polyimide, or polyurethane.

Optionally, material of the active layer 13 includes one of polysilicon, single crystal silicon, or metal oxide. For example, it can be indium gallium zinc oxide (IGZO), zinc oxide, indium tin oxide and indium tin zinc oxide, etc.

Optionally, material of the flat layer 15 may be an organic transparent film layer, such as transparent photoresist, epoxy resin, polyimide, polyvinyl alcohol, polymethyl methacrylate, polystyrene, and the like.

Optionally, in the first embodiment, the base plate 100 further includes a first insulating layer 17. The first insulating layer 17 is provided on the active layer 13. The gate electrode 12 is provided on the first insulating layer 17.

The active layer 13, the first insulating layer 17, and the gate electrode 12 are stacked to form a protrusion structure TC. The barrier layer 14 covers an outer surface of the protrusion structure TC.

In the first embodiment, the barrier layer 14 is used to cover an entire outer surface of the protrusion structure TC to further improve a performance of the thin film transistor TFT against water and oxygen.

Figure 2:
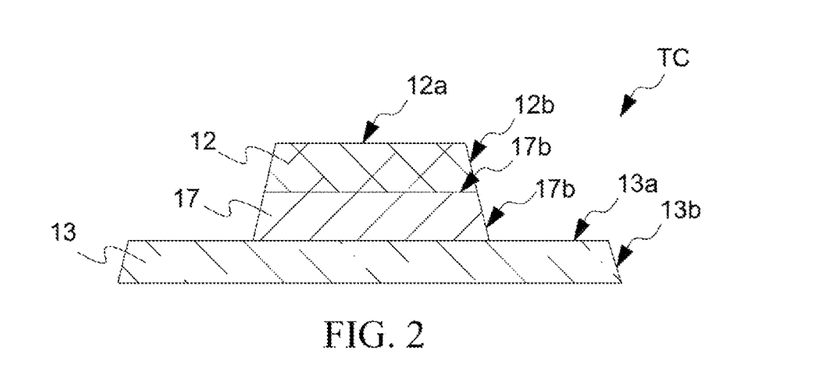
FIG. 2 is a schematic structural diagram of a protrusion structure of a first embodiment of a base plate provided by the present application.

Optionally, referring to FIGS. 1 and 2, the active layer 13 includes a first top surface 13a and a first side surface 13b connected to a periphery of the first top surface 13a.

The first insulating layer 17 is provided in a middle area of the first top surface 13a. The first insulating layer 17 includes a second top surface 17a and a second side surface 17b connected to a periphery of the second top surface 17a.

The gate electrode 12 is provided on the second top surface 17a. The gate electrode 12 includes a third top surface 12a and a third side surface 12b connected to a periphery of the third top surface 12a.

The barrier layer 14 covers a side area of the first top surface 13a, the first side surface 13b, the second side surface 17b, the third top surface 12a, and the third side surface 12b.

Optionally, material of the first insulating layer 17 may be silicon oxide, silicon nitride, or silicon oxynitride.

Optionally, the base plate 100 further includes a light-shielding layer 18, a buffer layer 19, and a second insulating layer 110. The light-shielding layer 18 is provided on the substrate 11. The light-shielding layer 18 is arranged to overlap the active layer 13. The buffer layer 19 is provided between the light-shielding layer 18 and the active layer 13. The second insulating layer 110 is disposed on the source-drain metal layer 16.

The source-drain metal layer 16 also includes a source electrode extension line 163. The source electrode extension line 163 is connected to the source electrode 161 and the light-shielding layer 18, respectively.

Since the barrier layer 14 and the flat layer 15 are arranged between the source electrode extension line 163 and the light-shielding layer 18, the distance between both of them is increased, thereby reducing the parasitic capacitance between both of them. That is, the stacked arrangement of the barrier layer 14 and the flattening layer 15 not only improves the performance of preventing the thin film transistor TFT from water and oxygen, but also flattens a complex terrain formed by a front-end process. Further, the parasitic capacitance between the light-shielding layer 18 and the source extension line 163 is reduced.

Optionally, the light-shielding layer 18 may be a molybdenum titanium stacked structure or a molybdenum copper stacked structure. Material of the buffer layer 19 may be silicon nitride or silicon oxide, or a stacked structure of a silicon nitride film layer and a silicon oxide film layer.

Optionally, the second insulating layer 110 may be a passivation layer, such as silicon oxide.

Optionally, a density of the barrier layer 14 is greater than or equal to 2.5 g/cm$^3$. Such a setting can achieve a relatively good effect of isolating water and oxygen. The density of the barrier layer 14 may be 2.5 g/cm$^3$, 3 g/cm$^3$, 3.5 g/cm$^3$, 5 g/cm$^3$, and so on.

Optionally, a thickness of the barrier layer 14 is between 300 angstroms and 500 angstroms, such as 300 angstroms, 400 angstroms, and 500 angstroms. The thickness of the barrier layer 14 is greater than or equal to 300 angstroms, so that the barrier layer 14 achieves a better effect of isolating water and oxygen. The thickness of the barrier layer 14 is less than or equal to 500 angstroms to prevent the barrier layer 14 from being too thick and increasing a terrain height of the thin film transistor region.

Optionally, the barrier layer 14 has a single-layer structure. Material of the barrier layer 14 includes metal oxide. For example, material of the barrier layer 14 may be metal oxides such as magnesium oxide, zinc oxide, aluminum oxide, nickel oxide, or tin oxide.

The barrier layer 14 is a dense oxide film formed of metal oxide. For example, a metal oxide can be used as a target, and a dense oxide film can be formed on the substrate 11 by sputtering.

Optionally, when the material of the barrier layer 14 is aluminum oxide ($Al_2O_3$), the ratio of oxygen to aluminum is 1.5:1. When the material of the barrier layer 14 is aluminum oxide (ZnO), the ratio of oxygen to zinc is 1:1. When the material of the barrier layer 14 is aluminum oxide (MgO), the ratio of oxygen to magnesium is 1:1.

Figure 3:
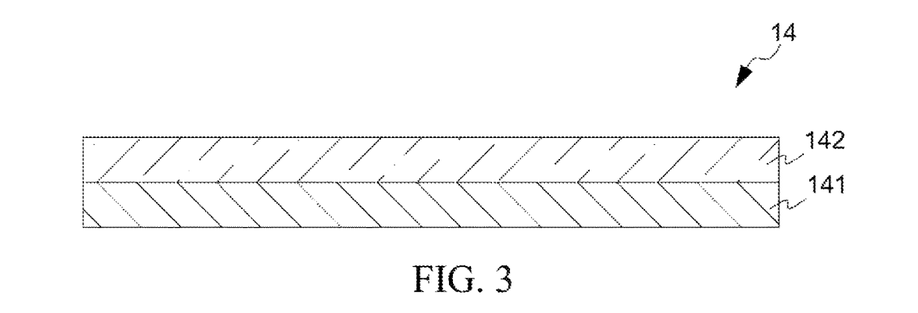
FIG. 3 is another schematic diagram of a barrier layer of a first embodiment of a base plate provided by the present application.

Optionally, in some embodiments, referring to FIG. 3, the barrier layer 14 includes a first barrier layer 141 and a second barrier layer 142. The second barrier layer 142 is disposed on the first barrier layer 141. The material of the first barrier layer 141 includes metal oxide. The material of the second barrier layer 142 includes silicon oxide.

The stacking of the first barrier layer 141 and the second barrier layer 142 can further improve the performance of preventing the thin film transistor TFT from water.

Optionally, the first barrier layer 141 and the second barrier layer 142 may also be alternately arranged.

The first barrier layer 141 is a dense oxide film formed of metal oxide. For example, a metal oxide can be used as a target, and a dense oxide film can be formed on the substrate 11 by sputtering. The metal oxide may be a metal oxide such as magnesium oxide, zinc oxide, aluminum oxide, nickel oxide, or tin oxide.

Figure 4:
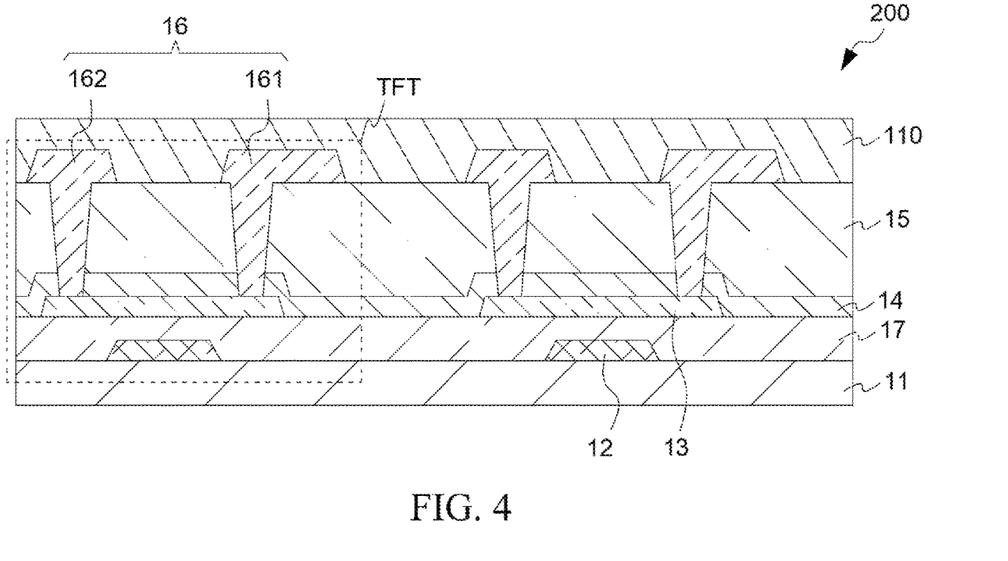
FIG. 4 is a schematic structural diagram of a second embodiment of a base plate provided by the present application.

Please referring to FIG. 4, the base plate 200 of this embodiment includes a substrate 11 and a plurality of thin film transistors TFT. A plurality of thin film transistors TFT are provided on the substrate 11.

The thin film transistor TFT includes a gate electrode 12, an active layer 13, a barrier layer 14, a flat layer 15, and a source-drain metal layer 16. The gate electrode 12 is provided on the substrate 11. The active layer 13 is disposed on the substrate 11 and is disposed in a different layer from the gate electrode 12. The active layer 13 is arranged to overlap the gate electrode 12. The barrier layer 14 at least covers the active layer 13 and the gate electrode 12. The barrier layer 14 is used to block water and oxygen. The flat layer 15 covers the barrier layer 14. The source-drain metal layer 16 includes a source electrode 161 and a drain electrode 162, and the source-drain metal layer 16 is disposed on the flat layer 15. The source electrode 161 and the drain electrode 162 are respectively connected to the active layer 13.

A difference between the base plate 200 of this embodiment and the base plate 100 of the foregoing embodiment is that the base plate 200 further includes a first insulating layer 17. The first insulating layer 17 is provided on the gate electrode 12. The active layer 13 is provided on the first insulating layer 17. The second insulating layer 110 covers the source-drain metal layer 16 and the flat layer 15.

The barrier layer 14 covers an outer surface of the active layer 13.

Specifically, the barrier layer 14 covers a top surface of the active layer 13 and a side surface connected to the top surface.

The base plate 200 of this embodiment adopts the barrier layer 14 to cover the active layer 13, and adopts the flat layer 15 to planarize the stacked structure of the gate electrode 12, the first insulating layer 17, and the active layer 13, thereby improving the luminous efficiency of the panel.

Figure 5:
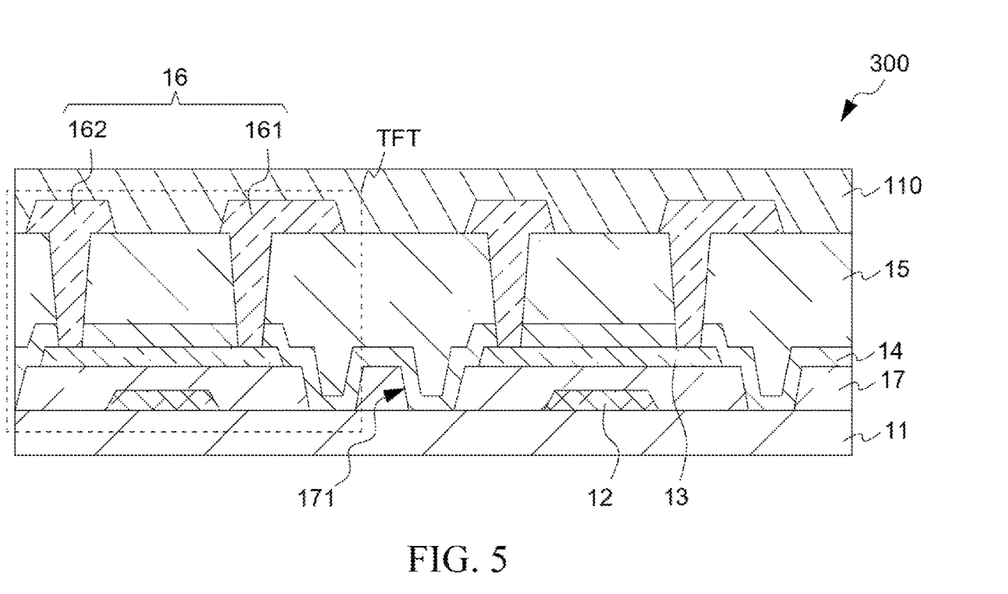
FIG. 5 is a schematic structural diagram of a third embodiment of a base plate provided by the present application.

Referring to FIG. 5, the difference between the base plate 300 of this embodiment and the base plate 200 of the foregoing embodiment is that the first insulating layer 17 is provided with a trench 171. The trench 171 is arranged around the outer periphery of the gate electrode 12, and the barrier layer 14 covers the trench 171.

The flat layer 15 covers the stacked structure of the gate electrode 12, the first insulating layer 17, and the active layer 13, and has a convex topography of the flat stacked structure. The flat layer 15 also covers the trench 171 to flatten the recessed terrain of the trench 171, so as to provide a flat base surface for the subsequent film layer. Therefore, the luminous efficiency of the panel is improved.

The base plate 300 of this embodiment is based on the base plate 200 of the above embodiment and is provided with a trench 171 around an outer periphery of the gate electrode 12. In addition, the barrier layer 14 is used to extend into the trench 171 such that the barrier layer 14 covers the active layer 13 and the gate electrode 12, which improves the performance of preventing the thin film transistor TFT from water and oxygen.

Figure 6:
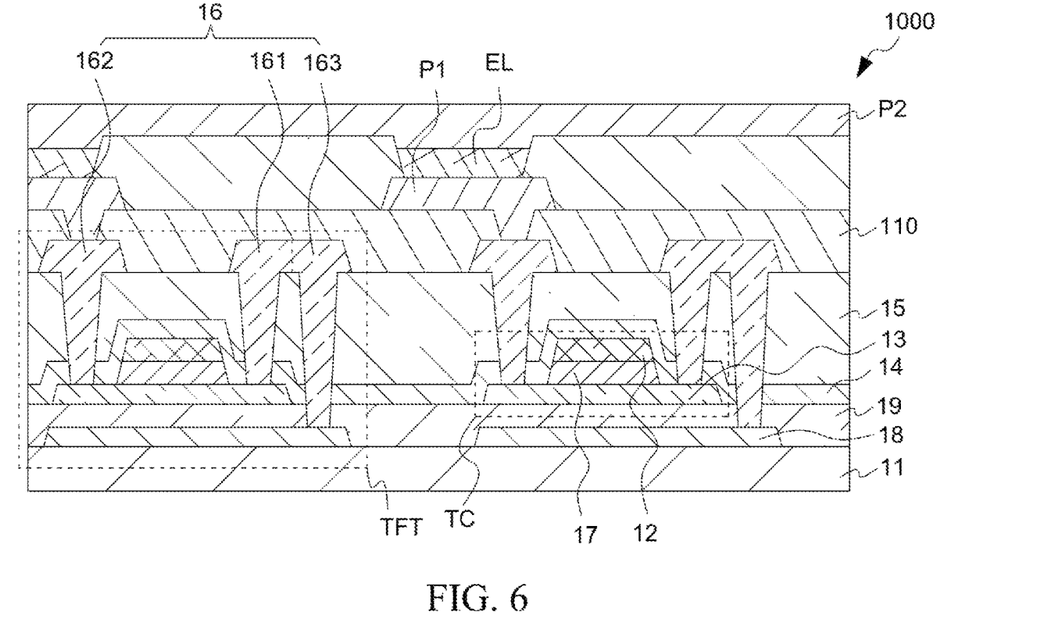
FIG. 6 is a schematic diagram of a structure of a first embodiment of a display panel provided by an embodiment of the present application.

Correspondingly, referring to FIG. 6, an embodiment of the present application further provides a display panel 1000, which includes the base plate (100/200/300) as described in the foregoing embodiment. The display panel 1000 further includes a first electrode P1, a light-emitting layer EL, and a second electrode P2, all of which are stacked. The first electrode P1 is connected to the drain electrode 162.

The display panel 1000 of this embodiment uses the base plate 100 of the embodiment as an example for illustration, but it is not limited thereto.

The first electrode P1 is an anode, and the second electrode P2 is a cathode. In some embodiments, the first electrode P1 may also be a cathode, and the second electrode P2 may be an anode.

Optionally, the material of the light-emitting layer EL can be an organic material, for example, Alq3, bis(2-methyl-8-hydroxyquinoline-N1,O8)-(1,1'-biphenyl-4-hydroxy)aluminum (BAlq), DPVBi, Almq3, 3-tert-butyl-9,10-bis(2-naphthalene)anthracene (TBADN).

The material of the light-emitting layer EL can also be an inorganic material, for example, can be selected from one or more of group IV semiconductor nanocrystals, group II-V semiconductor nanocrystals, group II-VI semiconductor nanocrystals, group IV-VI semiconductor nanocrystals, and group III-V semiconductor nanocrystals, and III-VI group semiconductor nanocrystals. As an example, it can be one or more of silicon quantum dots, germanium quantum dots, cadmium sulfide quantum dots, cadmium selenide quantum dots, cadmium telluride quantum dots, zinc selenide quantum dots, lead sulfide quantum dots, lead selenide quantum dots, indium phosphide quantum dots, indium arsenide quantum dots, or gallium nitride quantum dots, etc.

In the display panel 1000 of the embodiment of the present application, the thin film transistor TFT includes a gate electrode 12, an active layer 13, and a source-drain metal layer 16. The active layer 13 and the gate electrode 12 are arranged in different layers, and the active layer 13 is arranged to overlap the gate electrode 12. The barrier layer 14 covers at least the active layer 13 and the gate electrode 12, and the barrier layer 14 is used to block water and oxygen. The flat layer 15 covers the barrier layer 14, and the source-drain metal layer 16 is provided on the flat layer 15. The source-drain metal layer 16 includes a source electrode 161 and a drain electrode 162, and the source electrode 161 and the drain electrode 162 are connected to the active layer 13, respectively.

The display panel 1000 of the embodiment of the present application adopts a barrier layer 14 to at least cover the gate electrode 12 and the active layer 13 of the thin film transistor TFT to prevent external hydrogen, oxygen, and water vapor from intruding into the gate electrode 12 and the active layer 13. In addition, the flat layer 15 is used to flatten the active layer 13 and the gate electrode 12, thereby reducing the risk of the source-drain metal layer 16 and the above film being affected by complex topography. Further, the luminous efficiency of the display panel 1000 is improved.

Figure 7:
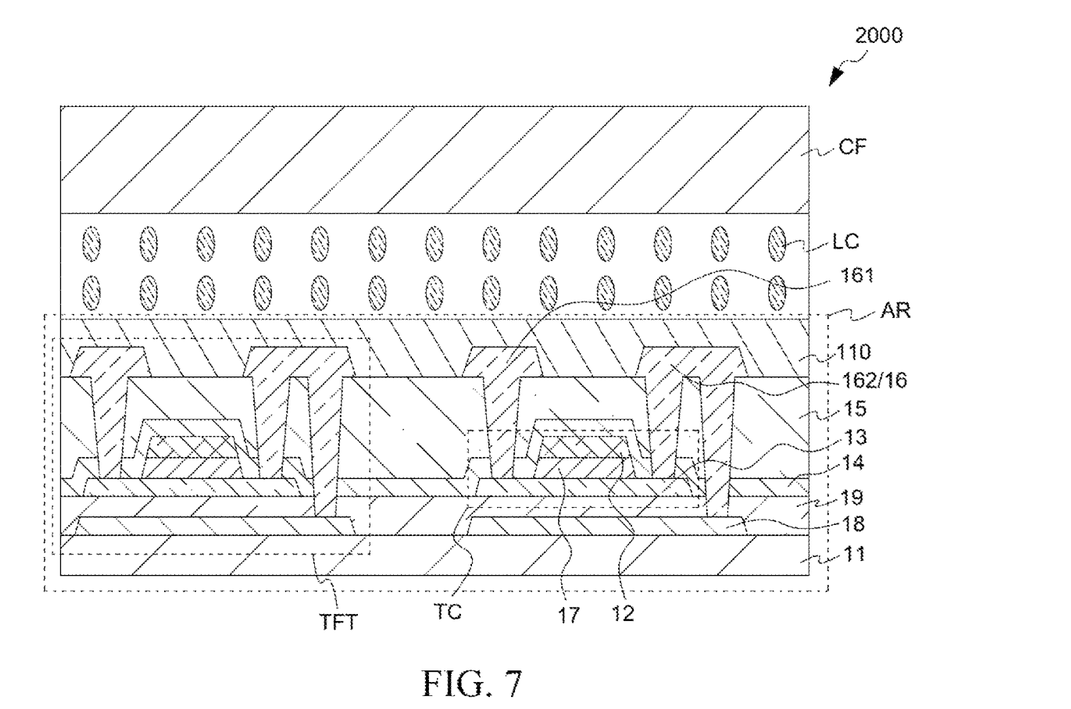
FIG. 7 is a schematic structural diagram of a second embodiment of a display panel provided by an embodiment of the present application.

Correspondingly, referring to FIG. 7, an embodiment of the present application also provides another display panel 2000, which includes an array substrate AR, a counter substrate CF, and a liquid crystal LC disposed between the array substrate AR and the counter substrate CF. The array substrate AR includes the base plate (100/200/300) of the above-mentioned embodiment.

The display panel 2000 of this embodiment takes the base plate 100 of the above-mentioned embodiment as a part of the array substrate AR as an example for illustration, but it is not limited to this.

In the display panel 2000 of the embodiment of the present application, the thin film transistor TFT includes a gate electrode 12, an active layer 13 and a source-drain metal layer 16. The active layer 13 and the gate electrode 12 are arranged in different layers, and the active layer 13 is arranged to overlap the gate electrode 12. The barrier layer 14 at least covers the active layer 13 and the gate electrode 12, and the barrier layer 14 is used to block water and oxygen. The flat layer 15 covers the barrier layer 14; the source-drain metal layer 16 is provided on the flat layer 15. The source-drain metal layer 16 includes a source electrode 161 and a drain electrode 162, and the source electrode 161 and the drain electrode 162 are connected to the active layer 13 respectively.

The display panel 1000 of the embodiment of the present application adopts a barrier layer 14 to at least cover the gate electrode 12 and the active layer 13 of the thin film transistor TFT to prevent external hydrogen, oxygen, and water vapor from intruding into the gate electrode 12 and the active layer 13. In addition, the flat layer 15 is used to flatten the active layer 13 and the gate electrode 12, thereby reducing the risk of the source-drain metal layer 16 and the above film being affected by complex topography. Therefore, the luminous efficiency of the display panel 1000 is improved.

The above is a detailed introduction to a base plate and a display panel provided by the embodiments of the present application, and specific examples are used in this article to illustrate the principles and implementations of the present application. The description of the above embodiment is only used to help understand the method and core idea of this application. At the same time, for those skilled in the art, according to the idea of this application, there will be changes in the specific implementation and the scope of application. From above, the content of this specification should not be construed as a limitation on this application.

The invention claimed is:

1. A base plate, comprising:
   a substrate; and
   a plurality of thin film transistors, wherein the thin film transistors are arranged on the substrate;
   wherein the thin film transistors comprise:
   a gate electrode, wherein the gate electrode is disposed on the substrate;
   an active layer, wherein the active layer is disposed on the substrate and arranged in a different layer from the gate electrode, and the active layer is arranged to overlap the gate electrode;
   a barrier layer, wherein the barrier layer at least covers the active layer and the gate electrode, and the barrier layer is used to block water and oxygen;
   a flat layer, wherein the flat layer covers the barrier layer; and
   a source-drain metal layer, wherein the source-drain metal layer is disposed on the flat layer, the source-drain metal layer comprises a source electrode and a drain electrode, and the source electrode and the drain electrode are respectively connected to the active layer;
   wherein the base plate further comprises a first insulating layer, the first insulating layer is disposed on the gate electrode, the active layer is disposed on the first insulating layer, and the barrier layer covers an outer surface of the active layer; and
   wherein the first insulating layer is provided with a trench, the trench is provided around an outer periphery of the gate electrode, and the barrier layer covers the trench.

2. The base plate according to claim 1, wherein the base plate further comprises a second insulating layer, wherein the second insulating layer is disposed on the source-drain metal layer.

3. The base plate according to claim 1, wherein a density of the barrier layer is greater than or equal to 2.5 g/cm$^3$.

4. The base plate according to claim 1, wherein the barrier layer has a single-layer structure, and material of the barrier layer comprises metal oxide.

5. The base plate according to claim 4, wherein when the material of the barrier layer is aluminum oxide, a ratio of oxygen to aluminum is 1.5:1;
   wherein when the material of the barrier layer is zinc oxide, a ratio of oxygen to zinc is 1:1; and
   wherein when the material of the barrier layer is magnesium oxide, a ratio of oxygen to magnesium is 1:1.

6. The base plate according to claim 1, wherein the barrier layer comprises a first barrier layer and a second barrier layer, the second barrier layer is disposed on the first barrier layer, material of the first barrier layer comprises metal oxide, and material of the second barrier layer comprises silicon oxide.

7. The base plate according to claim 1, wherein a thickness of the barrier layer ranges from 300 angstroms to 500 angstroms.

8. A display panel, comprising a base plate, wherein the display panel further comprises a first electrode, a light-emitting layer, and a second electrode that are stacked, and the first electrode is connected to a drain electrode, wherein the base plate comprises:
   a substrate; and
   a plurality of thin film transistors, wherein the thin film transistors are arranged on the substrate,
   wherein the thin film transistors comprise:
   a gate electrode, wherein the gate electrode is disposed on the substrate;
   an active layer, wherein the active layer is disposed on the substrate and arranged in a different layer from the gate electrode, and the active layer is arranged to overlap the gate electrode;
   a barrier layer, wherein the barrier layer at least covers the active layer and the gate electrode, and the barrier layer is used to block water and oxygen;
   a flat layer, wherein the flat layer covers the barrier layer; and
   a source-drain metal layer, wherein the source-drain metal layer is disposed on the flat layer, the source-drain metal layer comprises a source electrode and the drain electrode, and the source electrode and the drain electrode are respectively connected to the active layer;
   wherein the base plate further comprises a first insulating layer, the first insulating layer is disposed on the gate electrode, the active layer is disposed on the first insulating layer, and the barrier layer covers an outer surface of the active layer; and
   wherein the first insulating layer is provided with a trench, the trench is provided around an outer periphery of the gate electrode, and the barrier layer covers the trench.

9. The display panel according to claim 8, wherein the base plate further comprises a second insulating layer, wherein the second insulating layer is disposed on the source-drain metal layer.

10. The display panel according to claim 8, wherein a density of the barrier layer is greater than or equal to 2.5 g/cm$^3$.

11. The display panel according to claim 8, wherein the barrier layer has a single-layer structure, and material of the barrier layer comprises metal oxide.

12. The display panel according to claim 11, wherein when the material of the barrier layer is aluminum oxide, a ratio of oxygen to aluminum is 1.5:1;
  wherein when the material of the barrier layer is zinc oxide, a ratio of oxygen to zinc is 1:1; and
  wherein when the material of the barrier layer is magnesium oxide, a ratio of oxygen to magnesium is 1:1.

13. The display panel according to claim 8, wherein the barrier layer comprises a first barrier layer and a second barrier layer, the second barrier layer is disposed on the first barrier layer, material of the first barrier layer comprises metal oxide, and material of the second barrier layer comprises silicon oxide.

14. The display panel according to claim 8, wherein a thickness of the barrier layer ranges from 300 angstroms to 500 angstroms.

15. A display panel, comprising an array substrate, a counter substrate, and a liquid crystal disposed between the array substrate and the counter substrate; wherein the array substrate comprises a base plate;
  wherein the base plate comprises:
    a substrate; and
    a plurality of thin film transistors, wherein the thin film transistors are arranged on the substrate, wherein the thin film transistors comprise:
      a gate electrode, wherein the gate electrode is disposed on the substrate;
      an active layer, wherein the active layer is disposed on the substrate and arranged in a different layer from the gate electrode, and the active layer is arranged to overlap the gate electrode;
      a barrier layer, wherein the barrier layer at least covers the active layer and the gate electrode, and the barrier layer is used to block water and oxygen;
      a flat layer, wherein the flat layer covers the barrier layer; and
      a source-drain metal layer, wherein the source-drain metal layer is disposed on the flat layer, the source-drain metal layer comprises a source electrode and a drain electrode, and the source electrode and the drain electrode are respectively connected to the active layer;
  wherein the base plate further comprises a first insulating layer, the first insulating layer is disposed on the gate electrode, the active layer is disposed on the first insulating layer, and the barrier layer covers an outer surface of the active layer; and
  wherein the first insulating layer is provided with a trench, the trench is provided around an outer periphery of the gate electrode, and the barrier layer covers the trench.

16. The display panel according to claim 15, wherein the base plate further comprises a second insulating layer, wherein the second insulating layer is disposed on the source-drain metal layer.

* * * * *